United States Patent
Conroy et al.

(10) Patent No.: US 6,175,498 B1
(45) Date of Patent: Jan. 16, 2001

(54) BURN-IN BOARD AND HEAT SINK ASSEMBLY MOUNTING RACK

(75) Inventors: Chad M. Conroy; Mark W. Greenwood, both of Brooklyn Park, MN (US)

(73) Assignee: Micro Control Company, Minneapolis, MN (US)

(*) Notice: Under 35 U.S.C. 154(b), the term of this patent shall be extended for 0 days.

(21) Appl. No.: 09/352,559

(22) Filed: Jul. 13, 1999

(51) Int. Cl.[7] ................................................. H05K 7/20
(52) U.S. Cl. .................. 361/704; 361/707; 361/719; 361/720; 361/721; 361/752; 361/756; 165/80.3; 165/263; 165/104.33; 324/765
(58) Field of Search .................. 361/679, 683, 361/685, 686–690, 699, 704, 721, 719, 716, 724–729, 752, 754, 756; 165/80.3, 80.4; 312/223.2; 211/41.17

(56) References Cited

U.S. PATENT DOCUMENTS

| | | | |
|---|---|---|---|
| 4,900,948 | 2/1990 | Hamilton | 307/149 |
| 4,935,864 | * 6/1990 | Schmidt et al. | 361/719 |
| 5,164,661 | 11/1992 | Jones | 324/158 |
| 5,247,248 | * 9/1993 | Fukunaga | 324/760 |
| 5,414,370 | 5/1995 | Hashinaga et al. | 324/760 |
| 5,582,235 | 12/1996 | Hamilton et al. | 165/263 |
| 5,721,669 | * 2/1998 | Becker et al. | 361/685 |
| 5,790,373 | * 8/1998 | Kim et al. | 361/685 |
| 5,911,897 | * 6/1999 | Hamilton | 219/497 |
| 5,999,407 | * 12/1999 | Meschter et al. | 361/704 |

* cited by examiner

*Primary Examiner*—Leo P. Picard
*Assistant Examiner*—Boris Chervinsky
(74) *Attorney, Agent, or Firm*—Westman, Champlin & Kelly, P.A.

(57) ABSTRACT

A rack for supporting a plurality of burn-in boards and thermal boards which carry heat sinks to be associated with circuit chips mounted on the burn-in boards, has a first side frames that support the burn-in boards in a fixed position. Movable frames adjacent each of the side frame have a plurality of supports for thermal boards which include heat sinks, temperature sensors and other components. The movable frames are slidably mountable in a direction perpendicular to the burn-in board. Cams control the movement of the movable frames so that the thermal boards and components carried thereby can be moved from a position clearing the burn-in boards to permit insertion of the burn-in boards, onto the rack to a position wherein the components contact chips on the burn-in boards for good thermal control of the circuits on the burn-in boards.

15 Claims, 6 Drawing Sheets

BURN-IN BOARD AND HEAT SINK ASSEMBLY MOUNTING RACK

BACKGROUND OF THE INVENTION

The present invention relates to a rack for movably mounting a plate carrying heat sink with burn-in boards used for testing electronic circuits. The heat sinks are for dissipating heat from high power output circuits on chips being tested on the burn-in board.

Heat sinks and other temperature regulators of various types have been used for controlling the temperature of burn-in board components. U.S. Pat. No. 5,582,235 shows a type of temperature regulator where an impinging flow of gas is utilized for cooling circuit.

Another device that is used for individually controlling a temperature or plurality of semi-conductor devices in a burn-in oven is illustrated in U.S. Pat. No. 5,414,370.

In the control of temperature of a semi-conductor chip using heat sinks, it is important to have good thermal contact between the heat sink, and the semi-conductor device that is mounted on a burn-in board. This becomes more and more important as higher power circuits are used on semi-conductor chips are being tested, because of the heat dissipation requirements for such circuits.

It is difficult to obtain good thermal contact between the heat sink, and a temperature sensor used for sensing a temperature of the chip being tested by merely sliding a burn-in board in the oven rack relative to a fixed heat sink, or sliding in a board of heat sinks over installed circuit chips on a burn-in board on the rack. The present invention relates to moving a board carrying heat sinks for chips perpendicular to the plane of a burn-in board carrying the circuits for making thermal contact after the boards have been slid into a rack.

SUMMARY OF THE INVENTION

The present invention relates to a rack for supporting electronic circuit burn-in boards in an oven, and which also supports a thermal board carrying a plurality of heat sinks, one for each of the chips being tested. The movement is perpendicular to the plane of the burn-in board and moves the boards together for intimate contact not only of a temperature sensor carried by the heat sinks, but of the heat sink surface and the chip surface.

The rack of the present invention has a frame to reciprocate a thermal board carrying a plurality of heat sinks and temperature sensors, one for each of the chips on a burn-in board installed in the rack on separate fixed supports. The heat sinks and the temperature sensors on the heat sinks are both spring loaded so that they can accommodate some contact with the chip before the movable frame reaches its final position, without damaging the heat sink, the chip, or the temperature sensor. A positive drive for the movable frame, which in the form of the invention carries the heat sinks and temperature sensors, can be used. The movable frame is slidable relative to fixed base supports, with one of the burn-in or thermal boards mounted on the fixed supports and the other board mounted on the movable frame. Once the boards are installed and aligned, the boards on the movable frame are moved toward the boards on the fixed supports will be guided into position with suitable guide pins and receptacles on the respective boards. The movable frame is positively driven by a cam arrangement operated through a stepper motor and gear box, so that the positioning and moving of the frame can be very precisely done by counting and controlling the steps of the stepper motor.

The boards have suitable connections for coolant, and for receiving temperature signals as well as for other controls. The burn-in boards are connected in a normal manner through control circuitry that will be used for testing the circuits on the integrated circuit chips on the burn-in board.

The specific forms of the burn-in boards and the heat sinks are shown by way of example, but the reciprocating supports for two boards that must mate can be used with a wide variety of different types of heat sinks, heat exchangers cooling devices, and temperature sensors, used in connection with burn-in boards.

DETAILED DESCRIPTION OF THE ILLUSTRATIVE EMBODIMENTS

Figure 1:
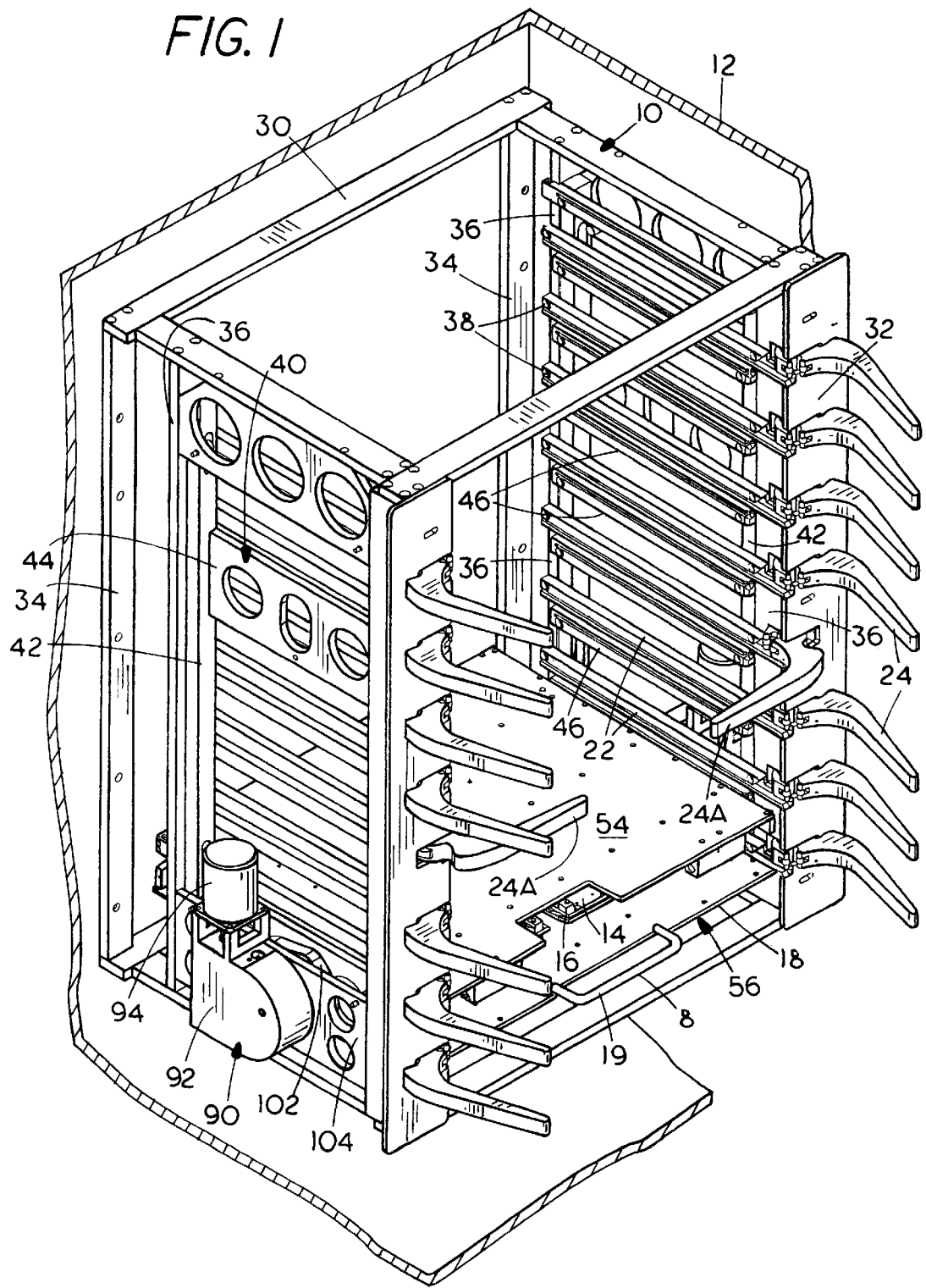
FIG. 1 is a perspective view of a burn-in board rack and heat sink board frame made according to the present invention.

Referring first to FIG. 1, a burn-in board and thermal board rack indicated generally at 10 is installed in a furnace shown at 12, only fragmentarily. The furnace 12 is a typical burn-in board furnace that is heated in a normal manner, and it provides a heated environment for testing integrated circuit chips, such as those shown schematically at 14 in FIG. 2, where the chips are supported in suitable supports 16 and mounted onto a burn-in board 18. The burn-in board 18 is a conventional design, and each of the integrated circuits on a chip that is illustrated generally at 16 is controlled with suitable burn-in board controls 20. The burn-in board controls, the power and the like are connected to the burn-in boards normally through a back connector in a conventional manner, and the circuits are individually controlled for testing under heated conditions.

Figure 2:
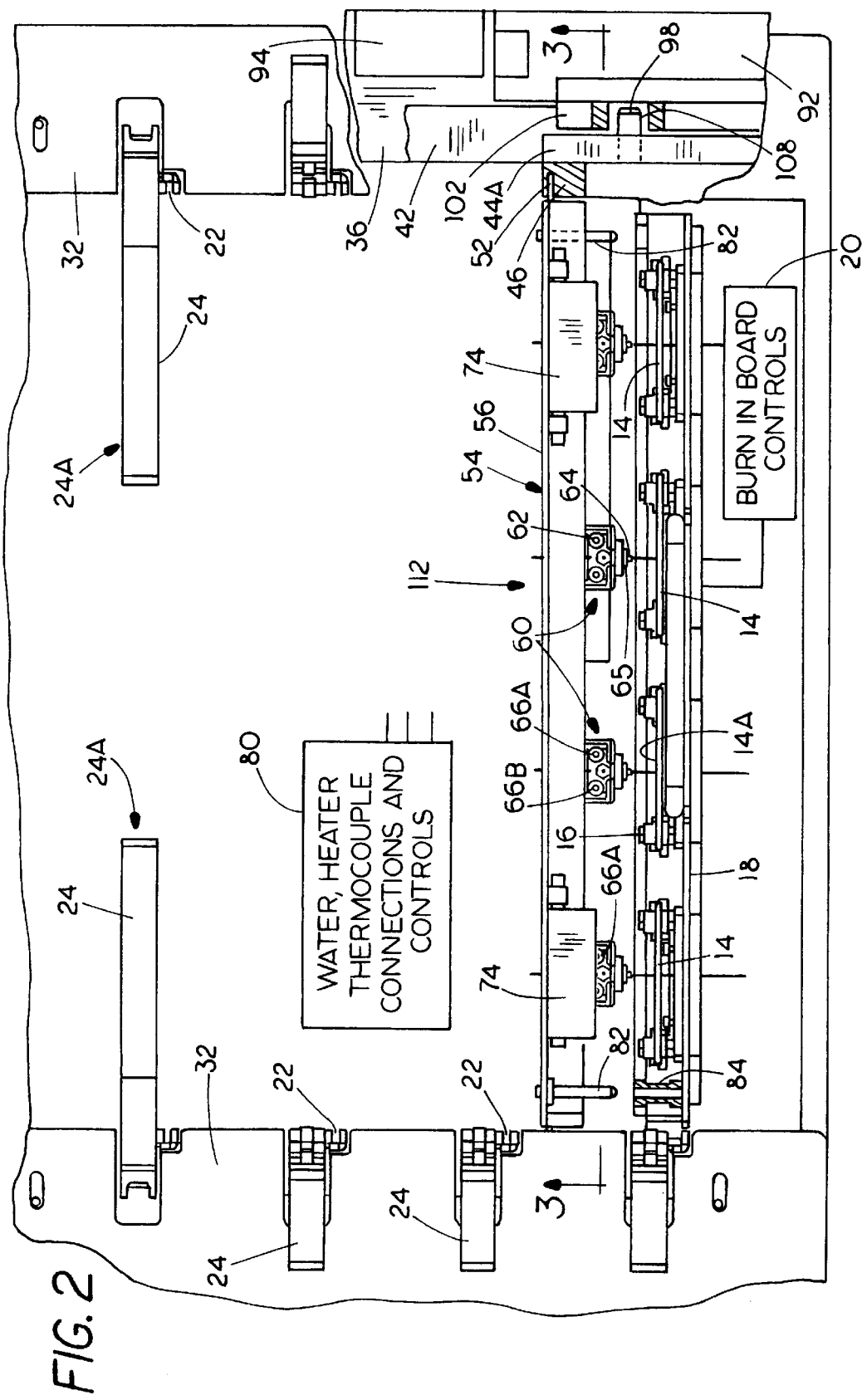
FIG. 2 is a front elevational view of a typical burn-in board and heat sink board shown in conjunction with the other.

The burn-in boards 18 are supported on edge guides fixed to the rack frame 30 and shown at 22 in FIG. 1, and also shown in FIG. 2. The guides 22 receive flanges on the burn-in board in a normal manner, so that the burn-in boards will slide into place along the guides 22 and be held horizontally.

Burn-in board extractor handles are indicated at 24, and these are pivoting handles that can be used for engaging portions of the edge of the burn-in boards and pivoted to the position shown at 24A in FIG. 1 to insert the connectors at the back of the burn-in board oven 12, and then pivoted to the position shown with them pivoted out for extracting the associated board.

In FIG. 1, only the lower burn-in board 18 is shown. It has a handle 19 for sliding it in and out until the extractors can be operated for final insertion.

Figure 4:
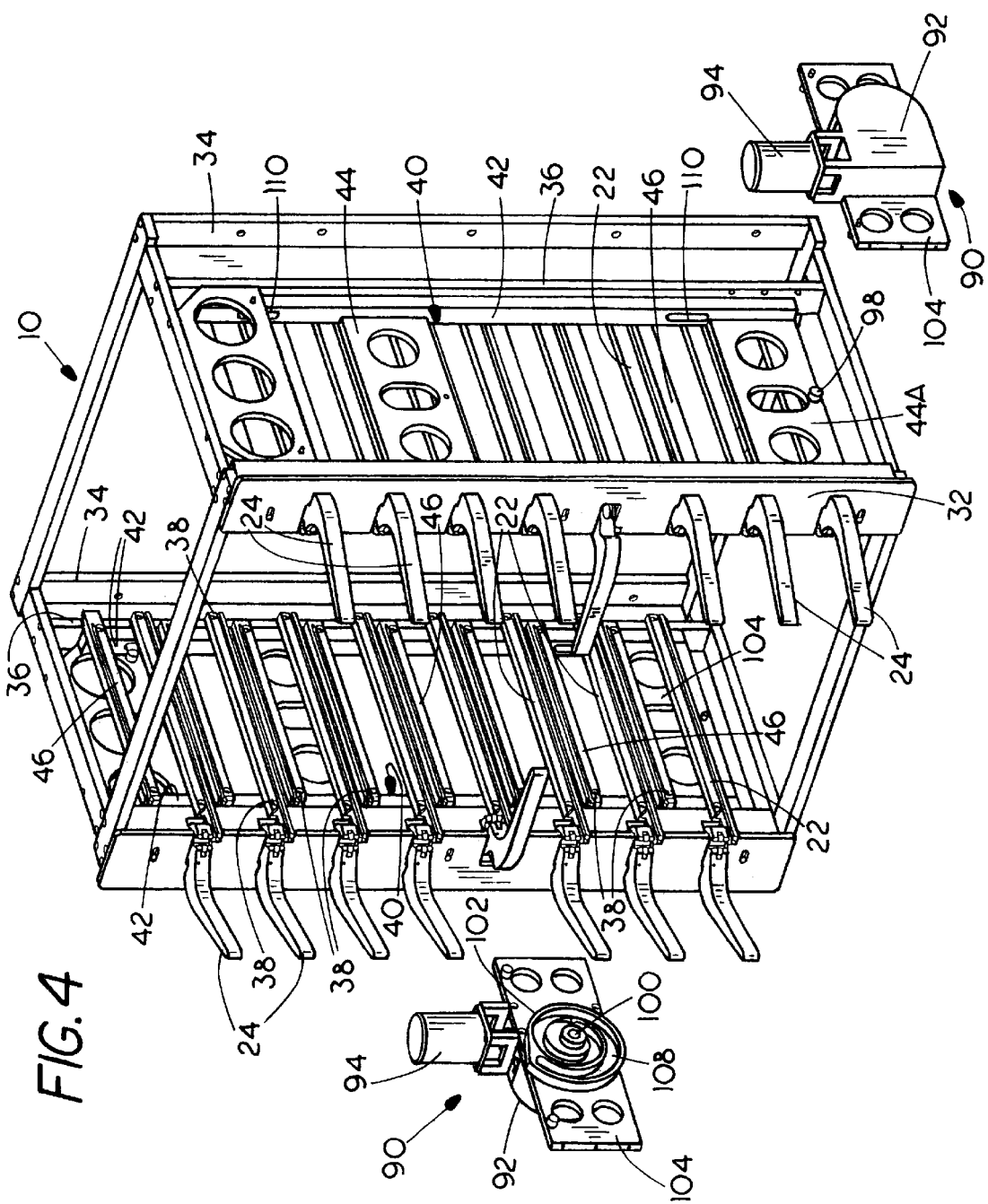
FIG. 4 is a perspective view of the rack of FIG. 1 from an opposite side, and with the drive cams for the movable rack shown in exploded position.
Figure 5:
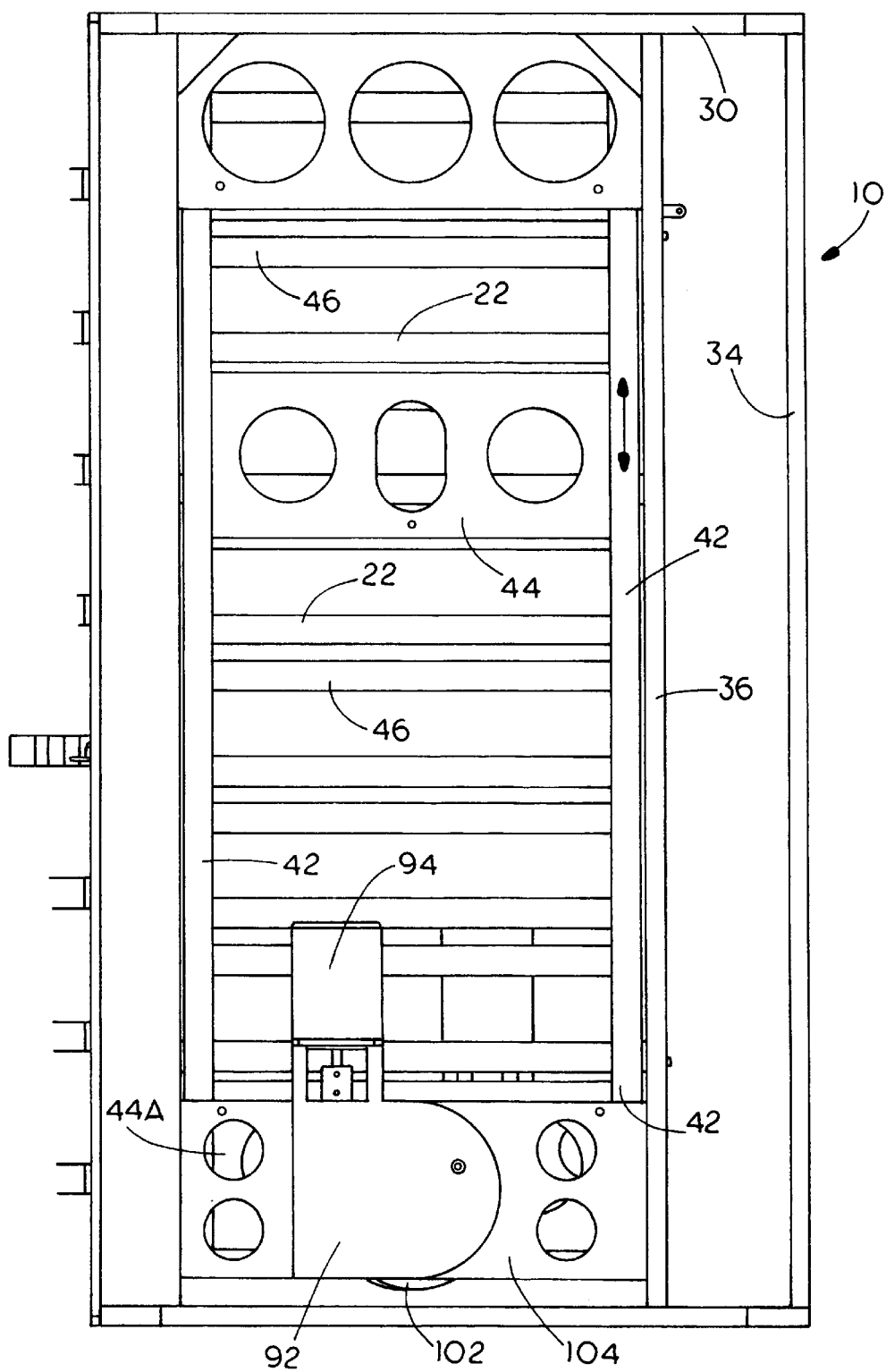
FIG. 5 is a side elevational view of the rack of FIG. 1.
Figure 6:
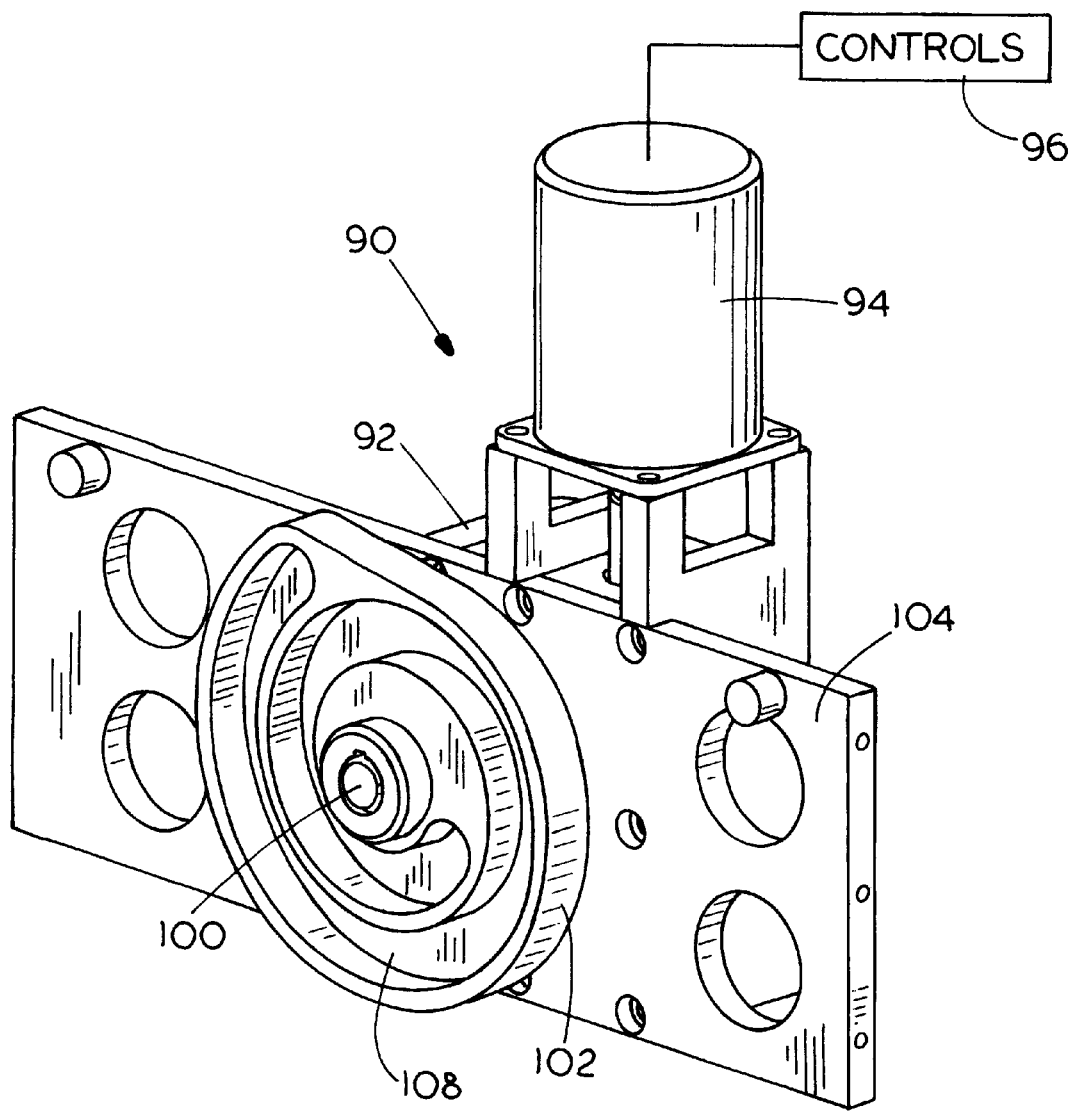
FIG. 6 is a perspective view of a cam assembly used for driving the movable frame of the present invention.

The rack 10 includes rack frame 30, made of plurality of members and these frame members include front frame members 32 which mount the extractor assemblies 24. The rack frame 30 includes upright frame members 34 at the corners. In addition, the rack frame 30 has stationary upright corner guide members 36 at all four corners, on which the guides or tracks 22 are bolted, as at 38, shown in FIG. 1. The guides 22 are bolted at both the front and rear. The bolts 38 for the front are shown in FIG. 4. The upright corner members 36 are parallel to the side walls of the furnace, and extend along the sides of the rack 10. The corner guide members 36 are used for guiding a movable slidably guidable reciprocating support frame shown generally at 40.

There is a movable slidably guidable support frame 40 at each side of the rack 10, and each slidably guiable support frame 40 includes upright sliding members 42, and cross braces 44 at suitable locations. The upright members 42 also have cross slides 46 for thermal boards bolted thereto as at 48, at opposite ends, so that these slides 46 (as shown there are 8 such cross slides on each frame) will move up and down with the slidably guidable support frame 40, as guided between the upright corner members 36. The slides 46 have grooves 50 that, as shown in FIG. 2, will receive side flanges 52 of thermal board assemblies 54.

Figure 3:
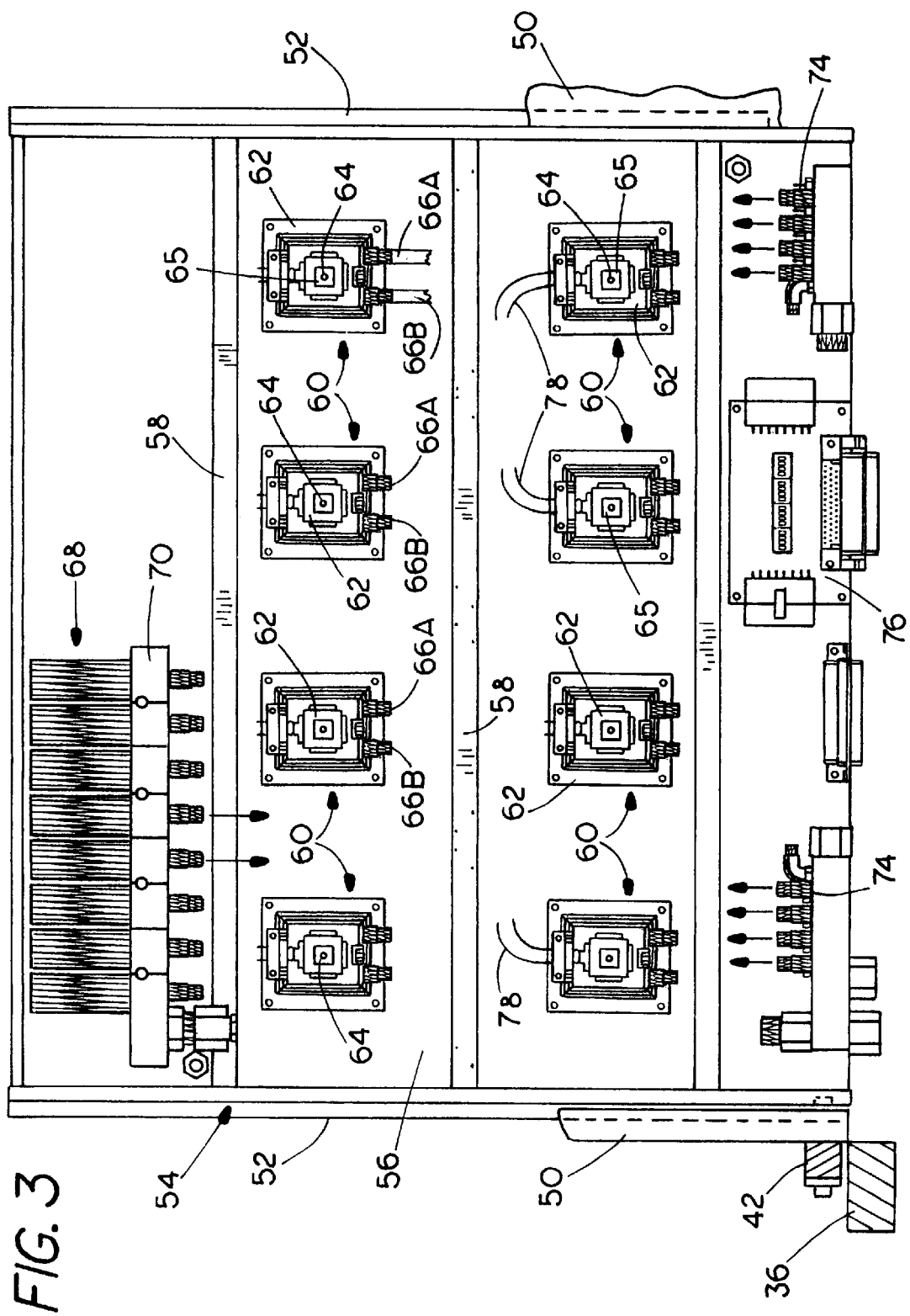
FIG. 3 is an illustrative bottom plan view example of a typical heat sink board or a thermal board used with the present invention.

The thermal board assemblies 54 are supported above and adjacent to mating burn-in board assemblies 18, and as shown in FIG. 3, each thermal board 54 includes a plate 56, which is made of aluminum or some other good heat conductor, and which is reinforced with cross braces 58. The thermal board plates 56 have openings therethrough which support a cage assembly 60 in which a spring mounted heat sink block 62 is mounted. The heat sink block 62 also includes a central temperature sensor 64, which protrudes from the lower surface of the heat sink block and is spring loaded. The entire heat sink block itself is spring loaded in an upward direction for limited movement within the outer cage 60. The details of this arrangement are more fully disclosed in U.S. Pat. No. 5,911,897, issued Jun. 15, 1999 owned by the same assignee. The heat sinks can be of any desired design.

The heat sink blocks shown each include connections shown at 66A for inputting water for cooling, and having an output connection 66B for drain water. Suitable solenoid valves indicated at 68 are provided on a valve block 70 (see FIG. 3) to provide water to the connections 66A and control of the solenoid valves is through the sensors 64 which comprise thermocouples that sense the temperature of the circuits on the chips 14. In addition, a flow of a gas onto the mating surfaces of the heat sinks and chips is provided from suitable gas manifolds 74. A circuit board 76 is provided for connecting leads 78 of temperature sensor 64 for providing signals to one or more controllers shown schematically at 80.

It should be noted that the view of FIG. 3 s taken in an upward direction in FIG. 2, and the bottom of the thermal board assembly is illustrated. Only one thermal board assembly 54 is illustrated for clarity and explanation.

The plate 56 is provided with vertical guide pins 82 at diagonally opposite corners, as shown, and these guide pins 82 will fit into tubular guides 84 mounted onto the burn-in board 18 that is associated with the particular thermal board. The guide pins 82 will positively guide the two boards together, so that they are mated and the temperature sensor 64 and heat sink blocks associated with them are in correct registry.

When the testing of the burn-in boards is to take place, a burn-in board 18 containing the chips 14 is properly mounted on the fixed guide and connected to the connectors is slid into the guides 22 in each of the positions in a rack, that is to be used. A thermal board assembly 54 is slid into position above such burnin board 18, on the associated guide 46. When the parts are positioned as shown at FIG. 2, the thermal board assembly 54 is at its raised position, as shown in the drawings of FIGS. 1 and 4, and the movable frames are held in place with cam drive assemblies 90 comprising power operators. Each cam drive assembly or power operator is mounted on one of the sides of the frame to control movement of one of the movable slidably guidable side support frames 40. The cam drive assembly includes a gear box 92 driven from a stepper motor 94, which are independently controlled, but through the central controller shown at 96 the position of each of the motors can be counted, and stepped so that they move exactly alike. The gear boxes 92 are mounted onto a fixed cross member or cross plate 104, which plates are fixed to the lower portions of the upright members 36 forming part of the rack frame 30 at each of the corners of the rack 10. The cross members 104 support the gear boxes in a suitable manner, as shown. The gear boxes 92 have output shafts 100 that extend through the respective support plate 104. The shafts 100 have drivably mounted spiral cams 102 thereon, which are on the inside of the cross members 104. The cams are in position so that the cam grooves 108 will receive the cam followers 98 on the lower cross members 44A of the respective movable frame 40. The upright members 42 are slidably guided between two of the fixed upright guide members 36, and suitable bearings can be placed in the locations indicated by the slots 110, so that the movement up and down relative to the upright guide members 36 is done without binding or excessive friction. Low friction material bearing strips also can be used, such as teflon or the like.

It can be seen that when the cam follower 98 on each of the lower cross members 44A is in its respective cam groove 108, and the motors 94 are stepped, the cams 102 will rotate and the cam follower pins 98 will be move vertically at a changing distance relative to the center of rotation of the shafts 100. Thus the cams will move the movable frames 40 downwardly, when the motors 92 are driven in the appropriate direction, and the thermal board assembly 54 on each set of side guides will be moved down as indicated by the arrow 112 in FIG. 2 toward the burn-in boards 18 and thus toward the circuit boards 14. The pins 82 will move into the guides 84, and the continued motion of the cams will force the temperature sensors, and the lower surface 65 of the heat sink blocks against the upper surface 14A of the chips, under a spring load, and cause good positive thermal contact between the temperature sensor 64, the heat sink surface 65, and the respective circuit chip 14.

Then, after the parts have been mated, the oven would be closed, raised to its temperature, and the control of the burn-in boards would proceed in a normal manner. The flow of coolant into the cooling blocks or heat sinks would be controlled by the temperature sensed by the temperature sensor 64 and this would maintain the temperature of the chips in a desired range. The heat sinks also can have heaters thereon to aid in controlling temperature.

When the test was completed, the stepper motors 94 would be reversed, and the cams 102 would rotate so that the cam follower pins 98 would move the thermal board assemblies 54 upwardly, so that the temperature sensor 64 and the heat sinks blocks 62 will clear the burn-in boards 18 so that the burn-in boards can be removed from the oven by swinging the extractors 24 outwardly as shown in FIG. 1 and FIG. 4 for removing the boards. The thermal boards can be left in position in the rack, for the next batch of test burn-in boards. The assembly thus provides for a positive, simple way of moving two boards in a burn-in system relative to each other to cause good heat conductive contact between heat sinks, temperature sensors and the like and underlying or overlying circuit chips.

It should be noted that if the connectors at the back of the burn-in boards are made movable, the burn-in boards could be raised and lowered as well, because of the need for a positive contact for the connectors used in the burn-in test connecting to the controls for the thermal board is easier in that flexible cables can be used, or other suitable connectors.

While one form of cam has been shown, other types of drive members or power operators can be used for reciprocating the frames carrying the thermal boards. For example, the linear actuators such as ball screws or hydraulic actuators could be utilized, solenoids that act directly could be utilized, rack and pinions or other gear arrangements can be used as well. The type of guide that supports the thermal board is not of criticality either, but the sliding flanges that slide in grooves on a support is an economical and satisfactory way of supporting the thermal board. Other details, such as the extractors and the like can be modified to suit the operators.

Although the present invention has been described with reference to preferred embodiments, workers skilled in the art will recognize that changes may be made in form and detail without departing from the spirit and scope of the invention.

What is claimed is:

1. A rack for mounting a burn-in board and a separate thermal board carrying first components that mate with second components on the burn-in board, the burn-in board and thermal board comprising first and second boards, the rack comprising a rack frame, a support that is fixed relative to the rack frame, a support frame slidably guidable relative to the rack frame and supporting the first board, said slidably guidable support frame being slidably mounted on at least one fixed support supporting the second board, and a power operator for moving the slidably guidable support frame relative to the fixed support between a position wherein components on the first board clear components on the second board and a position wherein the components on the first board engage components on the second board.

2. The rack of claim 1, wherein the burn-in boards are mounted on the fixed support.

3. The rack of claim 1, wherein the first board comprises the thermal board, and the thermal board having heat sinks thereon, one of which heat sinks is positioned to bear against a chip circuit comprising a component on the burn-in board when the power operator moves to cause engagement of the first and second components on the first and second boards.

4. The rack of claim 1, wherein said power operator comprises a cam member.

5. The rack of claim 1, wherein said power operator comprises a spiral cam member.

6. The rack of claim 1, wherein there are a plurality of second supports fixed relative to the rack frame and a plurality of first supports mounted on the slidably guidable support frame, each of the second supports being substantially parallel to one of the first supports, and wherein there are a plurality of thermal and burn-in boards slidably mounted in the first and second supports, respectively.

7. The rack of claim 1, wherein said burn-in and thermal boards are substantially planar, and said thermal board is made of a heat conducting material.

8. The rack of claim 1, wherein the rack frame has side frame members, said side frame members being spaced apart, and the burn-in and thermal boards fitting between the side frame members, the fixed support and the slidably guidable frame extending in a direction such that the burn-in and thermal boards move between the side frame members.

9. The rack of claim 1, wherein said slidably guidable support frame comprises a cross member, a cam follower on the cross member, said power operator comprising a motor driven cam that engages the cam follower, and a drive motor for driving the cam to move the cam follower and the first board relative to the second board.

10. The rack of claim 1 and guide pins on the first board, and the second board having guide receptacles for receiving said guide pins as the first board is moved toward the fixed board.

11. A support rack for supporting a plurality of burn-in boards in a burn-in oven, said support rack including a movable frame supporting a plurality of thermal boards one thermal board associated with each of the burn-in boards, said support rack having side members, a plurality of fixed supports for receiving the burn-in boards on each of the side members, the movable frame being mounted for reciprocation in a direction generally perpendicular to the burn-in boards mounted on each of the side members, the movable frame carrying a plurality of supports for thermal boards, and heat sinks supported on the thermal boards for contacting individual chips on each of the associate burn-in boards, and a power operator for reciprocating said movable frame relative to the burn-in boards for moving the thermal boards from a position wherein heat sinks carried thereby clear components on an associated burn-in board to a position wherein the heat sinks carried thereby are in thermally coupled relationship to chips on the associated burn-in boards.

12. The rack of claim 11, wherein said power operator comprise a cam member for moving the movable frame relative to the side members.

13. The rack of claim 11, wherein said fixed supports comprise side guide tracks for sliding the burn-in boards and the thermal boards in a direction parallel to the side members, respectively.

14. The rack of claim 11, wherein the movable frame comprises a separate frame member adjacent each of the side members, and the power operator comprises a separate cam follower on each separate frame member, and a separate cam to drive each of the separate cam followers.

15. The rack of claim 14, wherein the cams are each driven by a separate stepper motor which are controlled to operate simultaneously.

* * * * *